United States Patent
Buynoski

(10) Patent No.: US 6,916,696 B1
(45) Date of Patent: Jul. 12, 2005

(54) METHOD FOR MANUFACTURING A MEMORY ELEMENT

(75) Inventor: Matthew S. Buynoski, Palo Alto, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 29 days.

(21) Appl. No.: 10/718,459

(22) Filed: Nov. 20, 2003

(51) Int. Cl.⁷ ............................................. H01L 21/8238
(52) U.S. Cl. ................................. 438/200; 438/780
(58) Field of Search .......................... 438/200, 233, 438/366, 595, 628, 634, 780, 974

(56) References Cited

U.S. PATENT DOCUMENTS

| | | | |
|---|---|---|---|
| 4,765,860 A | | 8/1988 | Ueno et al. |
| 5,346,730 A | | 9/1994 | Kruck et al. |
| 5,952,671 A | * | 9/1999 | Reinberg et al. ............ 257/3 |
| 6,072,716 A | | 6/2000 | Jacobson et al. |
| 6,077,729 A | * | 6/2000 | Harshfield .................. 438/128 |
| 6,106,659 A | | 8/2000 | Spence et al. |
| 6,358,842 B1 | | 3/2002 | Zhou et al. |
| 2001/0055649 A1 | | 12/2001 | Ogure et al. |
| 2002/0012756 A1 | | 1/2002 | Kuckertz et al. |
| 2002/0146556 A1 | | 10/2002 | Pankow et al. |
| 2002/0163030 A1 | | 11/2002 | Mandell et al. |
| 2002/0163829 A1 | | 11/2002 | Bulovic et al. |
| 2002/0163830 A1 | | 11/2002 | Bulovic et al. |
| 2002/0163831 A1 | | 11/2002 | Krieger et al. |

* cited by examiner

*Primary Examiner*—Phuc T. Dang
(74) *Attorney, Agent, or Firm*—Rennie Wm. Dover; Paul Drake

(57) ABSTRACT

A method for manufacturing the memory device by plasma decomposition of sulfur dioxide. A first copper electrode having a surface is provided. The surface of the first copper electrode may be made amorphous. A copper sulfide layer, $Cu_xS$, where $1 \leq x \leq 2$, is disposed on the copper surface by decomposing sulfur dioxide in an ambient containing excess hydrogen. The copper sulfide layer may be is cuprous sulfide or cupric sulfide. A second copper electrode is coupled to the copper sulfide layer.

23 Claims, 2 Drawing Sheets

METHOD FOR MANUFACTURING A MEMORY ELEMENT

FIELD OF THE INVENTION

The present invention relates, in general, to memory devices and, more particularly, to memory devices that include sulfide based memory elements.

BACKGROUND OF THE INVENTION

Semiconductor component manufacturers are constantly striving to decrease the cost of manufacturing their products. One technique for reducing cost has been to shrink or reduce the lateral dimensions of the devices that make up the semiconductor components. In addition to shrinking the lateral dimensions, devices have been made even smaller by stacking metal interconnect layers that route signals to the various devices in the semiconductor component. The combination of shrinking and stacking has allowed manufacturers to increase the number of semiconductor components that can be manufactured from a single semiconductor wafer. These techniques have been especially beneficial for manufacturers of memory devices because these types of semiconductor components are formed as arrays that consume a large area of the semiconductor wafer. Shrinking the memory devices not only increases the number of memory components that can be manufactured from a single semiconductor wafer, but also decreases their access times.

In recent years memory device manufacturers have further increased the number of memory elements that can be made from a single semiconductor wafer by forming the memory elements above the semiconductor material containing the driver circuitry. For example, memory device manufacturers have used ferroelectric memory materials and polymeric memory materials disposed over a semiconductor material to form memory devices. Although these techniques have increased the number of memory elements that can be manufactured from a single semiconductor wafer, they have also increased the complexity and cost of manufacturing memory devices.

Accordingly, what is needed is a method for manufacturing the semiconductor memory device that is compatible with standard processing equipment and that is cost efficient.

SUMMARY OF THE INVENTION

The present invention satisfies the foregoing need by providing a method for manufacturing the memory device and a method for manufacturing a semiconductor component having a sulfide based memory element. In accordance with one aspect, the present invention includes a method for manufacturing a memory device comprising forming a first electrode. A memory element is disposed over the first electrode, wherein the memory element comprises a sulfide of copper. A second electrode is coupled to the first electrode.

In accordance with another aspect, the present invention comprises a method for manufacturing a semiconductor component including a sulfide based memory element by providing a semiconductor substrate having a semiconductor device formed therefrom. A first electrode is formed over the semiconductor substrate and electrically coupled to the semiconductor device. A memory element is disposed over the first electrode, wherein the memory element comprises sulfur derived from sulfur dioxide. A second electrode is coupled to the memory element.

In accordance with another aspect, the present invention comprises a method for manufacturing a semiconductor component including a sulfide based memory element by providing a semiconductor substrate having a semiconductor device formed therefrom. A first electrode is formed over the semiconductor substrate and electrically coupled to the semiconductor device. A memory element is disposed over the first electrode, wherein the memory element comprises sulfur derived from hydrogen sulfide. A second electrode is coupled to the memory element.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Generally, the present invention provides a method for manufacturing a memory device having a memory element comprising a sulfide of copper ($Cu_xS$, where x is greater than or equal to one and less than or equal to two, i.e., $1 \leq x \leq 2$). In accordance with one embodiment, the memory device comprises a layer of copper sulfide formed by decomposing sulfur dioxide in a reaction chamber having a reducing ambient. In one aspect, the copper sulfide is formed on a copper electrode. The decomposition of the sulfur dioxide generates hydrogen sulfide that reacts with the copper electrode to form a sulfide of copper such as, for example, cuprous sulfide or cupric sulfide. After formation of the memory element, an electrode is coupled to the sulfide layer. An advantage of the present invention is that the formation of the sulfide layer can be readily integrated into semiconductor process flows. In accordance with another embodiment, a memory element comprising a sulfide of copper is coupled to a semiconductor device.

Figure 1:
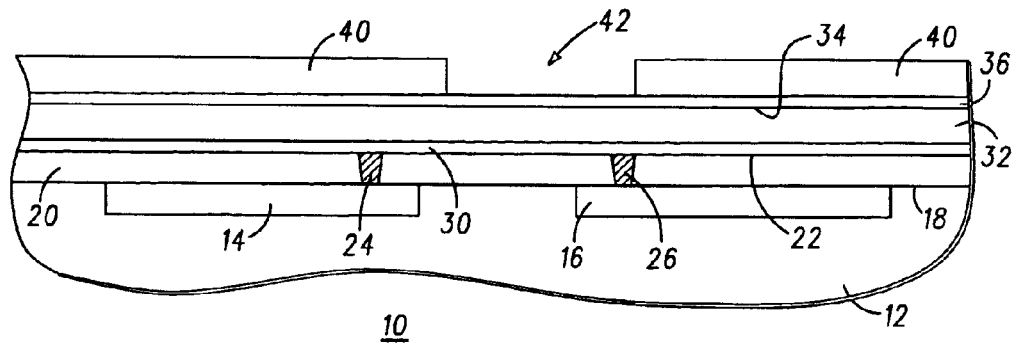
FIGS. 1–6 are enlarged cross-sectional side views of a semiconductor component during manufacture in accordance with an embodiment of the present invention.

FIG. 1 is an enlarged cross-sectional side view of a semiconductor component during an intermediate stage of manufacture in accordance with an embodiment of the present invention. What is shown in FIG. 1 is a portion of a semiconductor substrate 12 in which semiconductor devices 14 and 16 have been fabricated. Semiconductor substrate 12 has a major surface 18. It should be understood that semiconductor devices 14 and 16 have been shown in block form and that the type of semiconductor device and the number of semiconductor devices are not limitations of the present invention. Suitable semiconductor devices include active elements such as, for example, N-channel or P-channel insulated gate field effect transistors, complementary insulated gate field effect transistors, junction field effect transistors, NPN or PNP bipolar junction transistors, and diodes; passive elements such as, for example, capacitors, resistors, and inductors; and combinations of active elements, passive elements, or both. Likewise, the material of semiconductor substrate 12 is not a limitation of the present invention. Substrate 12 can be silicon, Silicon-On-Insulator (SOI), Silicon-On-Sapphire (SOS), silicon germanium, germanium, an epitaxial layer of silicon formed on a silicon substrate, or the like. In addition, semiconductor substrate 12 may be comprised of compound semiconductor materials such as gallium-arsenide, indium-phosphide, or the like.

A layer of dielectric material 20 having a major surface 22 is formed on semiconductor substrate 12 and electrical contacts 24 and 26 are formed in portions of dielectric material 20. Preferably, electrical contacts 24 and 26 are fabricated by forming tapered contact openings or holes in dielectric layer 20 to expose portions of semiconductor devices 14 and 16, respectively. The tapered contact openings are filled with a metal such as, for example, tungsten. It should be understood the shape of the contact openings is not a limitation of the present invention. For example, the contact openings may be non-tapered. The combination of dielectric material 20 and electrical contacts 24 and 26 is referred to as an interconnect layer. When electrical contacts 24 and 26 are metal, the interconnect layer is also referred to as a metal interconnect layer. Techniques for forming semiconductor devices such as devices 14 and 16, dielectric material 20, and electrical contacts 24 and 26 are known to those skilled in the art.

An etch stop layer 30 having a thickness ranging from approximately 200 Angstroms (Å) to approximately 1,000 Å is formed on dielectric layer 20 and on electrical contacts 24 and 26. By way of example, etch stop layer 30 has a thickness of 500 Å. Suitable materials for etch stop layer 30 include dielectric materials such as, for example, silicon nitride ($Si_xN_y$), silicon oxynitride (SiON), silicon rich nitride ($Si_xRN_y$), silicon carbide (SiC), diamond-like carbon (DLC), hydrogenated oxidized silicon carbon material (SiCOH), or the like.

A layer of dielectric or insulating material 32 having a surface 34 and a thickness ranging from approximately 2,000 Å to approximately 15,000 Å is formed on etch stop layer 30. Preferably, dielectric layer 32 has thickness ranging between 4,000 Å and 12,000 Å. By way of example, insulating layer 32 has a thickness of about 10,000 Å and comprises a material having a dielectric constant ($\kappa$) lower than that of silicon dioxide. It is desirable to use materials for dielectric layer 32 having a lower dielectric constant than silicon dioxide to reduce the capacitance of the memory device or structure and to improve its performance. Suitable low $\kappa$ dielectric materials include, but are not limited to, polyimide, spin-on polymers, poly(arylene ether) (PAE), parylene, xerogel, fluorinated aromatic ether (FLARE), fluorinated polyimide (FPI), dense SiLK, porous SiLK (p-SiLK), polytetrafluoroethylene, and benzocyclobutene (BCB). Suitable inorganic low $\kappa$ dielectric materials include, but are not limited to, hydrogen silsesquioxane (HSQ), methyl silsesquioxane (MSQ), fluorinated glass, or NANO-GLASS. It should be understood that the type of dielectric material for insulating layer 32 is not a limitation of the present invention and that other organic and inorganic dielectric materials may be used, especially dielectric materials having a dielectric constant less than that of silicon dioxide. Similarly, the method of forming dielectric layer 32 is not a limitation of the present invention. For example, dielectric layer 32 may be formed using, among other techniques, spin-on coating, spray-on coating, Chemical Vapor Deposition (CVD), Plasma Enhanced Chemical Vapor Deposition (PECVD), or Physical Vapor Deposition (PVD).

Still referring to FIG. 1, a hardmask 36 having a thickness ranging between approximately 300 Å and approximately 2,000 Å is formed on dielectric layer 32. Preferably, hardmask 36 has a thickness ranging between approximately 500 Å and approximately 1,000 Å and comprises one or more layers of a dielectric material such as, for example, SiON, $Si_xN_y$, $Si_xRN_y$, SiC, or SiCOH. A layer of photoresist 40 is patterned on hardmask 36 to have an opening 42. Because hardmask 36 is often chosen so that it lowers the reflection of light during the photolithography steps used in patterning photoresist layer 40, it may also be referred to as an Anti-Reflective Coating (ARC) layer.

Figure 2:
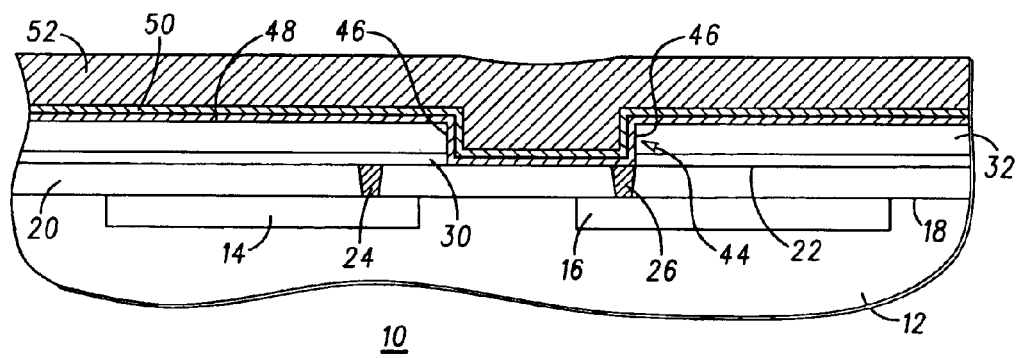

Referring now to FIG. 2, the portion of dielectric layer 32 that is not protected by patterned photoresist layer 40, i.e., the portions of hardmask 36 and dielectric layer 32 underlying opening 42, are etched using an anisotropic reactive ion etch to form an opening 44 having sidewalls 46. The anisotropic etch stops or terminates in or on etch stop layer 30. Photoresist layer 40 is removed using techniques known to those skilled in the art. The exposed portion of etch stop layer 30 and the remaining portions of hard mask 36 are removed using an anisotropic reactive ion etch.

Still referring to FIG. 2, a layer of, for example, tantalum 48 having a thickness ranging from approximately 200 Å to approximately 350 Å is formed on dielectric layer 32, sidewalls 46, the exposed portions of dielectric layer 20, and on electrical contact 26. Tantalum layer 48 may be formed using Chemical Vapor Deposition (CVD), Plasma Enhanced Chemical Vapor Deposition (PECVD), sputtering, evaporation, or the like. Preferably, tantalum layer 48 is conformally deposited on dielectric layer 32 and in opening 44. Tantalum layer 48 serves as a barrier layer to prevent diffusion of a subsequently deposited metal into dielectric layers 20 and 32 or into semiconductor devices 14 and 16. In addition, tantalum layer 48 provides a low contact resistance between electrical contact 26 and the subsequently deposited metal that will fill opening 44. Other suitable materials for barrier layer 48 include titanium (Ti), titanium nitride (TiN), tantalum nitride (TaN), a combination of tantalum (Ta) and tantalum nitride (TaN), tungsten (W), tungsten nitride (WN), titanium silicon nitride (TiSiN), and refractory metal compounds such as refractory metal nitrides, refractory metal carbides, or refractory metal borides.

For conductor materials such as copper, which are deposited by electroplating, a copper seed layer 50 is deposited on the barrier layer 48. Seed layer 50 is deposited to act as an electrode for the electroplating process. An electrical conductor 52 is deposited on seed layer 50 and fills opening 44. Although shown as distinct layers, it should be understood that seed layer 50 and electrical conductor 52 become a unitary structure.

Figure 3:
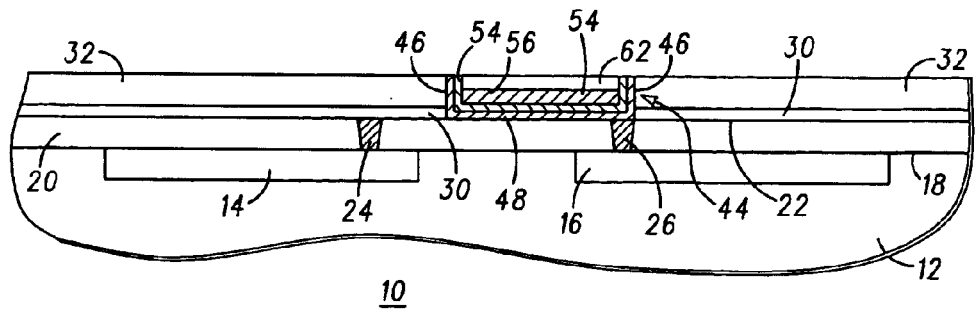

Referring now to FIG. 3, copper conductor 52 is planarized using, for example, a Chemical Mechanical Polishing (CMP) technique having a high selectivity to dielectric layer 32. Thus, the planarization stops on dielectric layer 32. After planarization, portion 54 of copper conductor 52 remains in opening 44 and has a surface 56. Portion 54 is referred to as the copper core. As those skilled in the art are aware, Chemical Mechanical Polishing is also referred to as Chemical Mechanical Planarization. It should be understood the planarization technique is not a limitation of the present invention. For example, other suitable planarization techniques include electropolishing, electrochemical polishing, chemical polishing, and chemically enhanced polishing.

Semiconductor component 10 is placed in a plasma etch chamber configured or plumbed to react sulfur dioxide with hydrogen. A clean may be performed to remove any native oxide that may have formed on surface 56 during the planarization step. Techniques for removing native oxide are known to those skilled in the art; for example the native oxide may be removed using a hydrogen plasma. After cleaning, copper core 54 may be annealed in an argon ambient.

A layer of cuprous sulfide 62 is formed on surface 56 using, for example, a plasma etch chamber, wherein cuprous sulfide layer 62 is formed in a sulfur-containing ambient. In a beginning step of forming cuprous sulfide layer 62, the ambient within the chamber is changed to a reducing ambient such as, for example, a hydrogen ambient, which reduces any copper oxide and converts the oxide to water which is released in a gaseous state. Equation 1 shows the reaction equation when the copper oxide layer is a cupric oxide layer and Equation 2 shows the reaction equation when the copper oxide layer is a cuprous oxide layer. In each reaction, copper is reduced and water is released as a gas.

$$CuO + H_2 \rightarrow Cu\downarrow + H_2O\uparrow \qquad \text{Equation 1}$$

$$Cu_2O + H_2 \rightarrow 2Cu\downarrow + H_2O\uparrow \qquad \text{Equation 2}$$

Sulfur dioxide and hydrogen are then introduced into the reaction chamber and reacted to release sulfur which reacts with the hydrogen to form hydrogen sulfide. The hydrogen sulfide reacts with the copper to form sulfides of copper, i.e., $Cu_xS$, where x is greater than or equal to one and less than or equal to two, i.e., $1 \leq x \leq 2$.

The sulfur dioxide is decomposed to release sulfur which reacts with the hydrogen to form hydrogen sulfide and with copper to form $Cu_xS$, where x is greater than or equal to one and less than or equal to two, i.e., $1 \leq x \leq 2$, as shown in Equations 3 and 4.

$$SO_2 + 3H_2 \rightarrow H_2S + 2H_2O\uparrow \qquad \text{Equation 3}$$

$$2H_2S + Cu_x \rightarrow Cu_xS + H_2\uparrow \qquad \text{Equation 4}$$

The hydrogen sulfide reaction product is more volatile than are the sulfides of copper, hence it is removed from the reaction chamber via the exhaust ports. $Cu_xS$, where $1 \leq x \leq 2$, are formed on copper surface 56. In accordance with one embodiment, a copper sulfide layer 62, i.e., $Cu_xS$, where $1 \leq x \leq 2$, having a thickness ranging from about 50 Å to about 200 Å is formed on copper surface 56. The flow of the sulfur dioxide and hydrogen gases are varied to partially control deposition rate uniformity. By way of example, the flow rates for the sulfur dioxide and hydrogen range from about 50 standard cubic centimeters per minute (sccm) to about 1,000 sccm. In addition, the deposition rate is partially controlled by the temperature within the chamber and the power levels of the plasma. A suitable range of temperatures is from about 20 degrees Celsius (° C.) to about 300° C., and a suitable power level is from a minimum needed to produce a plasma to about five to ten kilo-Watts. It should be understood that the type of chamber is not a limitation of the present invention and that another suitable chamber, among others, is a thin film deposition chamber.

Alternatively, cupric sulfide layer 62 may be formed using a source of sulfur other than sulfur dioxide. For example, rather than obtaining the sulfur by reducing sulfur dioxide, the sulfur may be derived from hydrogen sulfide. Semiconductor component 10 is placed in a plasma etch chamber configured or plumbed to react hydrogen sulfide with the copper disposed on semiconductor component 10. Preferably, the reaction is performed in an inert ambient such as, for example, an ambient comprising argon.

Figure 4:
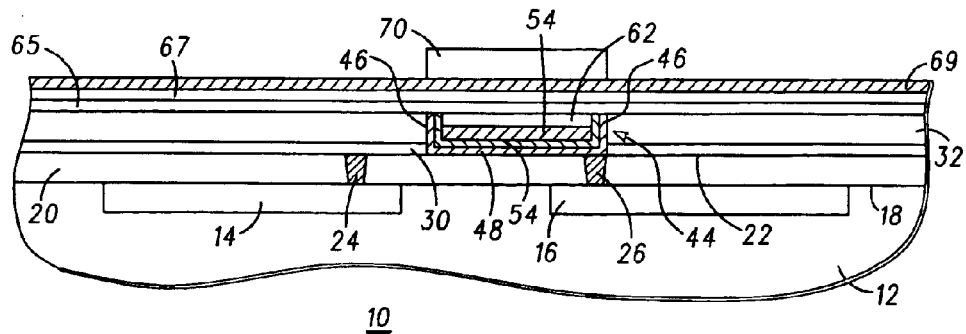

Referring now to FIG. 4, copper sulfide layer 62 and dielectric layer 32 are oxidized to form a dielectric layer 65 comprising copper oxide. By way of example, the thickness of dielectric layer 65 ranges from approximately 25 Å to approximately 1,000 Å. The copper oxide may be cuprous oxide ($Cu_2O$) or cupric oxide (CuO). A polymeric layer 67 is formed over dielectric layer 65. By way of example, polymeric layer 67 is polyphenylacetylene having a thickness ranging from approximately 300 Å to approximately 5,000 Å. Alternatively, the material of polymeric layer 67 may be diphenylacetylene or a combination of phenyl and diphenylacetylene. Techniques of forming copper oxide layers and polymeric layers are known to those skilled in the art.

In an alternative embodiment, dielectric layer 65 is not formed on copper sulfide layer 62. Rather, polymeric layer 67 is formed on copper sulfide layer 62 and dielectric layer 32. In other words, in this alternative embodiment, a copper oxide layer is not formed.

A conductive layer 69 comprising a combination of titanium and titanium nitride is formed on polymeric layer 67. Conductive layer 69 has a thickness ranging from approximately 50 Å to approximately 200 Å. Conductive layer 69 is also referred to as an upper electrode. A layer of photoresist 70 is patterned on conductive layer 69 to overlay the portions of conductive layer 69 disposed over copper sulfide layer 62 and to leave the other portions of conductive layer 69 exposed.

Figure 5:
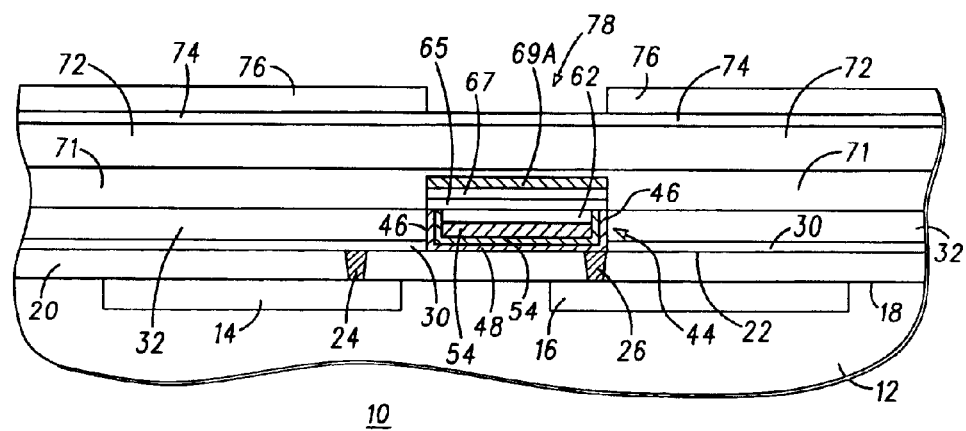

Referring now to FIG. 5, the exposed portions of conductive layer 69 are anisotropically removed using, for example, a reactive ion etch. Although the reactive ion etch may terminate on polymeric layer 67, it is preferable for the etch to terminate on dielectric layer 32.

An etch stop layer 71 having a thickness ranging from approximately 200 Å to approximately 1,000 Å is formed over dielectric layer 32 and the remaining portion 69A of conductor 69. By way of example, etch stop layer 71 has a thickness of 500 Å. Suitable materials for etch stop layer 71 include dielectric materials such as, for example, SiON, $Si_xN_y$, $Si_xRN_y$, SiC, SiCOH, or the like. A layer of dielectric material 72 is formed on etch stop layer 71. The types of material for dielectric layer 72, the thickness of dielectric layer 72, and the methods of forming dielectric layer 72 are the same as those described with reference to dielectric layer 32 shown in FIG. 1. A hardmask 74 having a thickness ranging from approximately 300 Å to approximately 2,000 Å is formed on dielectric layer 72. The types of material for hardmask 74, the thickness of hardmask 74, and the methods of forming hardmask 74 are the same as those described with reference to hardmask 36 shown in FIG. 1. A layer of photoresist 76 is patterned on hardmask 74 to have an opening 78.

Figure 6:
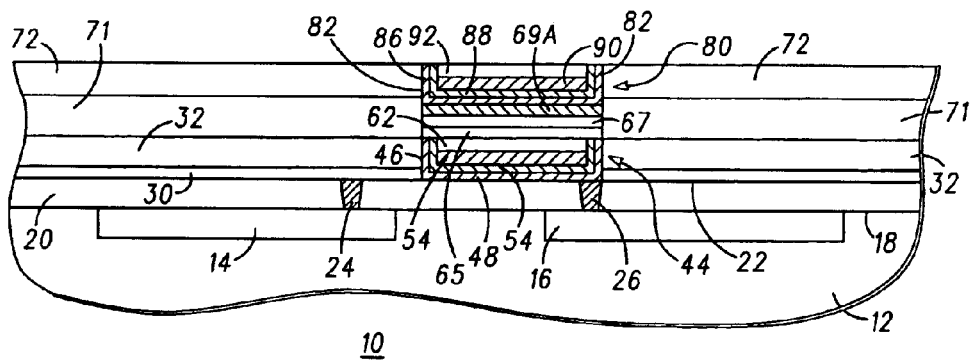

Referring now to FIG. 6, the portions of hardmask 74 and dielectric layer 72 that are not protected by patterned photoresist layer 76, i.e., the portions of hardmask 74 and dielectric layer 72 underlying opening 78 are etched using an anisotropic reactive ion etch to form an opening or via 80 having sidewalls 82. The anisotropic etch stops or terminates in or on etch stop layer 71. Photoresist layer 76 is removed using techniques known to those skilled in the art. The exposed portion of etch stop layer 71 and the remaining portions of hardmask 74 are removed using an anisotropic reactive ion etch.

Still referring to FIG. 6, a barrier layer of, for example, tantalum 86 having a thickness ranging from approximately 100 Å to approximately 350 Å is formed on dielectric layer 72, sidewalls 82, and portion 69A of conductive layer 69. The types of materials, thicknesses, and the methods of forming barrier layer 86 are the same as those described with reference to barrier layer 48 shown in FIG. 2. Likewise, barrier layer 86 serves a similar function as barrier layer 48.

A seed layer 88 such as, for example, a copper seed layer, is deposited on barrier layer 86 and acts as an electrode for an electroplating process. An electrical conductor is electroplated on seed layer 88 and fills via 80. It should be understood that seed layer 88 and the electrical conductor become a unitary structure. The copper conductor is planarized using, for example, a Chemical Mechanical Polishing (CMP) technique having a high selectivity to dielectric layer 72. Thus, the planarization stops on dielectric layer 72. After planarization, portion 90 of the copper conductor remains in via 80 and is referred to as the conductor core. The planarization process leaves a passivation layer 92 of, for example, an oxide or copper-complex, which is formed from portion 90.

By now it should be appreciated that a method for manufacturing a memory device has been provided. In accordance with an embodiment of the present invention, the memory device comprises a pair of copper electrodes coupled to each other by a memory element containing copper sulfide, $Cu_xS$, where $1 \leq x \leq 2$, that has been derived by plasma decomposition of sulfur dioxide. By way of example, the copper sulfide may be cuprous sulfide or cupric sulfide. Preferably, the plasma decomposition is performed in a plasma reactor having a reducing ambient comprising a sufficient amount of hydrogen to react with all the oxygen released by the decomposition reaction. Alternatively, the cupric sulfide layer may be formed using hydrogen sulfide as the sulfur source. An advantage of the present invention is that it can be integrated into a standard semiconductor component manufacturing flow in a cost efficient manner.

Although certain preferred embodiments and methods have been disclosed herein, it will be apparent from the foregoing disclosure to those skilled in the art that variations and modifications of such embodiments and methods may be made without departing from the spirit and scope of the invention. For example, the copper sulfide memory material can be formed on an amorphous copper layer to reduce non-uniformities caused by copper grain boundaries. The copper surface can be made amorphous by using argon sputtering; using a plasma treatment, wherein a plasma source is selected from the group of plasma sources consisting of ammonia, hydrogen, and argon; or using a low energy implantation process, wherein an implant species is a species selected from the group of species consisting of metal ions, germanium ions, arsenide ions, phosphorus ions, and boron ions. In addition, a polymer memory can be formed over the copper sulfide layer to further enhance the memory element. It is intended that the invention shall be limited only to the extent required by the appended claims and the rules and principles of applicable law.

What is claimed is:

1. A method for manufacturing a memory device, comprising:
    forming a first electrode;
    disposing a memory element over the first electrode, the memory element comprising a sulfide derived from sulfur dioxide; and
    forming a second electrode spaced apart from the first electrode.

2. The method of claim 1, wherein the first electrode comprises copper.

3. The method of claim 1, wherein disposing the memory element includes reacting the sulfur dioxide with hydrogen.

4. The method of claim 3, further including using a sufficient amount of hydrogen to react with at least 90% of the oxygen, wherein water is a reaction product.

5. The method of claim 1, wherein disposing the memory element includes decomposing the sulfur dioxide to form a layer of cuprous sulfide.

6. The method of claim 1, wherein disposing the memory element includes decomposing the sulfur dioxide in a plasma etch chamber.

7. The method of claim 6, wherein disposing the memory element includes flowing the sulfur dioxide into the plasma etch chamber at a flow rate ranging from about 50 sccm to about 1,000 sccm.

8. The method of claim 6, wherein disposing the memory element includes decomposing the sulfur dioxide in a plasma etch chamber at a power level of less than ten kilo-Watts.

9. The method of claim 6, wherein disposing the memory element includes maintaining the reaction temperature in the plasma etch chamber from about 20 degrees Celsius to about 300 degrees Celsius.

10. The method of claim 1, wherein the sulfide is $Cu_xS$, where $1 \leq x \leq 2$.

11. A method for manufacturing a memory element, comprising:
    providing a first copper substrate having a major surface;
    decomposing sulfur dioxide in the presence of hydrogen to form a copper sulfide $Cu_xS$ film on the major surface, where $1 \leq x \leq 2$; and
    coupling a second copper substrate to the cuprous sulfide film.

12. The method of claim 11, wherein decomposing the sulfur dioxide includes maintaining the reaction temperature from about 20 degrees Celsius to about 300 degrees Celsius.

13. The method of claim 11, further including using a sufficient amount of hydrogen to react with at least 90% of the oxygen, wherein water is a reaction product.

14. A method for manufacturing a semiconductor component, comprising:
    providing a semiconductor substrate having a semiconductor device formed therefrom;
    forming a first electrode over the semiconductor substrate and electrically coupled to the semiconductor device;
    disposing a memory element over the first electrode, wherein the memory element comprises sulfur derived from sulfur dioxide; and
    forming a second electrode coupled to the memory element.

15. The method of claim 14, wherein disposing the memory element over the first electrode comprises decomposing the sulfur dioxide in a plasma etch chamber.

16. The method of claim 14, wherein disposing the memory element over the first electrode includes disposing copper sulfide, $Cu_xS$, where $1 \leq x \leq 2$.

17. A method for forming a memory material, comprising:
    reacting hydrogen sulfide with copper to form a copper sulfide, $Cu_xS$, where $1 \leq x \leq 2$.

18. The method of claim 17, further including reacting sulfur dioxide with hydrogen to form the hydrogen sulfide.

19. The method of claim 18, wherein reacting the sulfur dioxide with the hydrogen sulfide is performed in one of a plasma reactor chamber or a thin film deposition chamber.

20. The method of claim 18, wherein reacting the hydrogen sulfide with the copper is performed in one of a plasma reactor chamber or a thin film deposition chamber.

21. The method of claim 18, wherein x is one of 1 or 2.

22. The method of claim 17, further including reacting the hydrogen sulfide with the copper in an inert gas.

23. The method of claim 22, wherein the inert gas is argon.

* * * * *